(12) United States Patent
Schuster (10) Patent No.: US 9,485,869 B2
(45) Date of Patent: Nov. 1, 2016

(54) RF PRINTED CIRCUIT BOARD INCLUDING VERTICAL INTEGRATION AND INCREASED LAYOUT DENSITY

(71) Applicant: Raytheon Company, Waltham, MA (US)

(72) Inventor: Gary P. Schuster, Larwill, IN (US)

(73) Assignee: RAYTHEON COMPANY, Waltham, MA (US)

( * ) Notice: Subject to any disclaimer, the term of this patent is extended or adjusted under 35 U.S.C. 154(b) by 76 days.

(21) Appl. No.: 14/516,018

(22) Filed: Oct. 16, 2014

(65) Prior Publication Data

US 2015/0200433 A1    Jul. 16, 2015

Related U.S. Application Data

(60) Provisional application No. 61/869,193, filed on Aug. 23, 2013.

(51) Int. Cl.
| | |
|---|---|
| *H05K 3/20* | (2006.01) |
| *H05K 3/46* | (2006.01) |
| *H05K 1/02* | (2006.01) |
| *H05K 1/16* | (2006.01) |

(52) U.S. Cl.
CPC .............. *H05K 3/20* (2013.01); *H05K 1/0237* (2013.01); *H05K 3/4694* (2013.01); *H05K 1/0218* (2013.01); *H05K 1/16* (2013.01); *Y10T 29/49128* (2015.01)

(58) Field of Classification Search
CPC .... H05K 3/20; H05K 1/0237; H05K 3/4694; H05K 1/0218; H05K 1/16; Y10T 29/49128
USPC ............................................................. 333/12
See application file for complete search history.

(56) References Cited

U.S. PATENT DOCUMENTS

| | | | |
|---|---|---|---|
| 7,507,915 B2 | 3/2009 | Chang et al. | |
| 8,168,893 B2* | 5/2012 | Ito | H01L 23/49838 174/260 |
| 8,269,327 B2 | 9/2012 | Leedy | |
| 8,284,562 B2 | 10/2012 | Lee et al. | |
| 2004/0012935 A1* | 1/2004 | Tagi | H05K 1/0233 361/761 |
| 2010/0142170 A1 | 6/2010 | Kim et al. | |
| 2012/0154072 A1* | 6/2012 | Bae | H03H 9/0557 333/133 |

* cited by examiner

*Primary Examiner* — Robert Pascal
*Assistant Examiner* — Kimberly Glenn
(74) *Attorney, Agent, or Firm* — Cantor Colburn LLP (57) ABSTRACT

A printed circuit board includes a plurality of sub-circuits that form at least one circuit channel. The printed circuit board further includes a first surface, a second surface opposite the first surface, and at least one layer interposed between the first and second surfaces. A plurality of surface portions are formed on the first surface. The printed circuit board further includes at least one embedded sub-circuit of the at least one circuit channel. The embedded sub-circuit is embedded in the at least one layer and is electromagnetically isolated from the plurality of surface portions.

19 Claims, 5 Drawing Sheets

RF PRINTED CIRCUIT BOARD INCLUDING VERTICAL INTEGRATION AND INCREASED LAYOUT DENSITY

DOMESTIC PRIORITY

This application is a non-provisional of U.S. patent application Ser. No. 61/869,193, filed Aug. 23, 2013, the disclosure of which is incorporated by reference herein in its entirety.

BACKGROUND

The present disclosure relates to printed circuit boards, and in particular, to non-planar fabricated radio frequency (RF) and microwave printed circuit boards.

Figure 1:
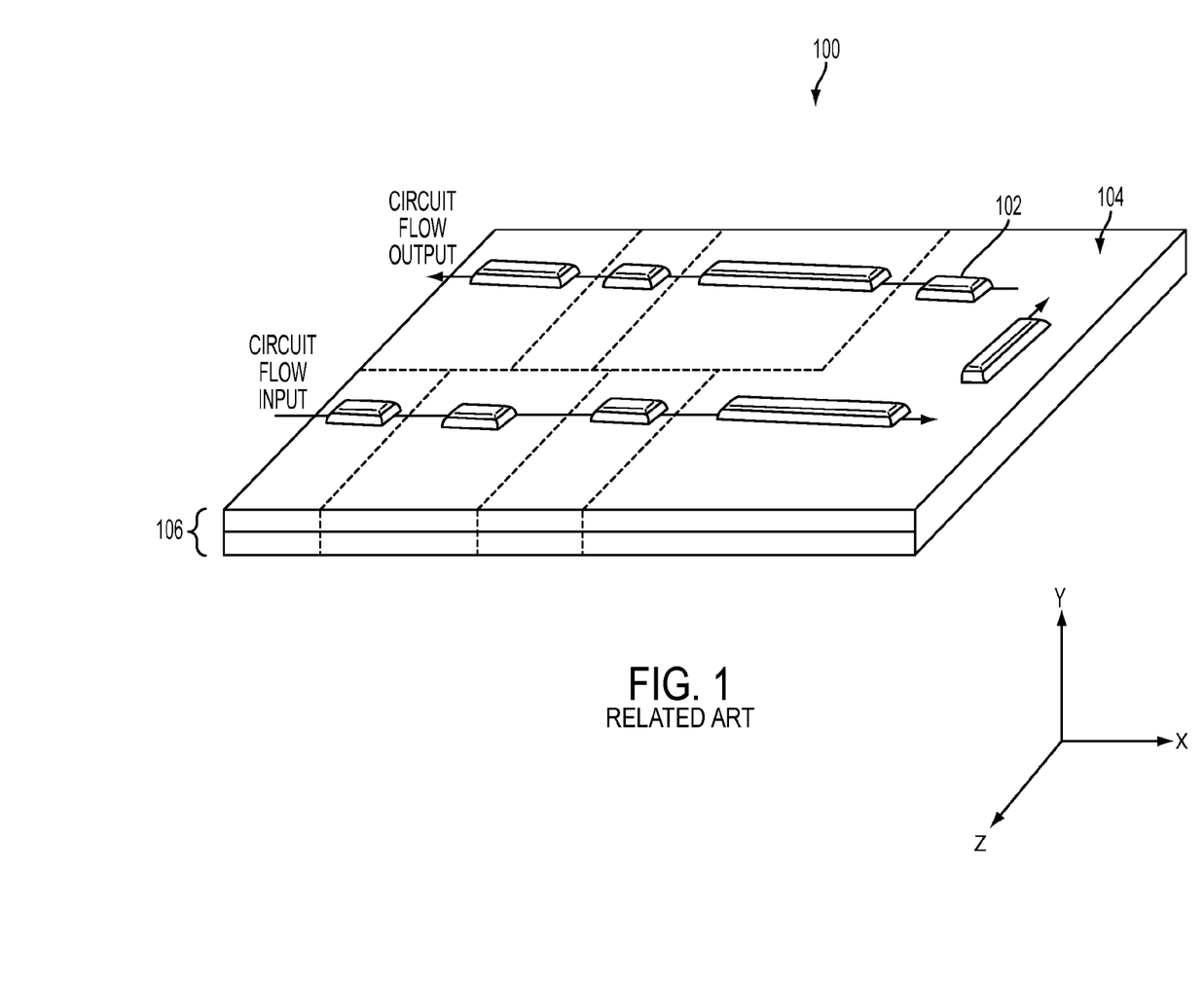
FIG. 1 is a perspective view of a conventional printed circuit board.

Conventional RF and microwave printed circuit boards (PCBs) have layout densities that are typically formed according to a planar fabrication design, as illustrated in FIG. 1. The planar fabrication design creates a PCB 100 where all electrical components 102 for performing a particular electrical function are formed on exterior surface regions 104 of the PCB 100. The layers 106 beneath the exterior surface regions 104, however, are configured to route signal lines, power lines and ground planes. Consequently, the layout of the conventional RF/microwave PCB 100 is limited by the exterior surface area of the board. As a result, the entire surface area of the board must be increased in order to increase the layout density of the overall PCB 100. Further, since the layers 106 of the conventional RF/microwave PCB 100 are used to route signal lines along a constant horizontal plane, the entire layer 102 is formed as a single electrically conductive layer.

SUMMARY

According to at least one exemplary embodiment, a printed circuit board including a plurality of circuit channels formed thereon comprises a body defining a length and a width. At least one layer extends perpendicular to the length and the width to define a height, and is interposed between a first surface and an opposing second surface. A plurality of surface portions are defined on at least one of the first surface and the second surface. The printed circuit board further includes at least one surface sub-circuit included with a first circuit channel among the plurality of circuit channels. The at least one surface sub-circuit is formed on at least one of the first and second surfaces. The printed circuit board further includes at least one embedded sub-circuit of the first circuit channel. The embedded sub-circuit is different from the at least one surface sub-circuit and is embedded in the at least one layer.

According to another exemplary embodiment, a printed circuit board includes a plurality of sub-circuits that form at least one circuit channel. The printed circuit board further includes a first surface, a second surface opposite the first surface, and at least one layer interposed between the first and second surfaces. At least one layer is isolated from the first and second surfaces. A plurality of surface portions are formed on the first surface. The printed circuit board further includes at least one embedded sub-circuit of the at least one circuit channel. The embedded sub-circuit is embedded in the at least one layer and is electromagnetically isolated from the plurality of surface portions.

According to yet another exemplary embodiment, a method of fabricating a printed circuit board comprises forming at least one layer between first and second opposing surfaces of the printed circuit board. The method further comprises forming a plurality of surface portions on at least one of the first and second surfaces. The method further comprises embedding at least one embedded sub-circuit of the at least one circuit channel in the at least one layer. The method further comprises electrically isolating at least one layer from the first and second surfaces such that at least one embedded sub-circuit is electrically isolated from the plurality of surface portions.

Additional features are realized through the techniques of the present invention. Other embodiments are described in detail herein and are considered a part of the claimed invention. For a better understanding of the invention and features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 2:
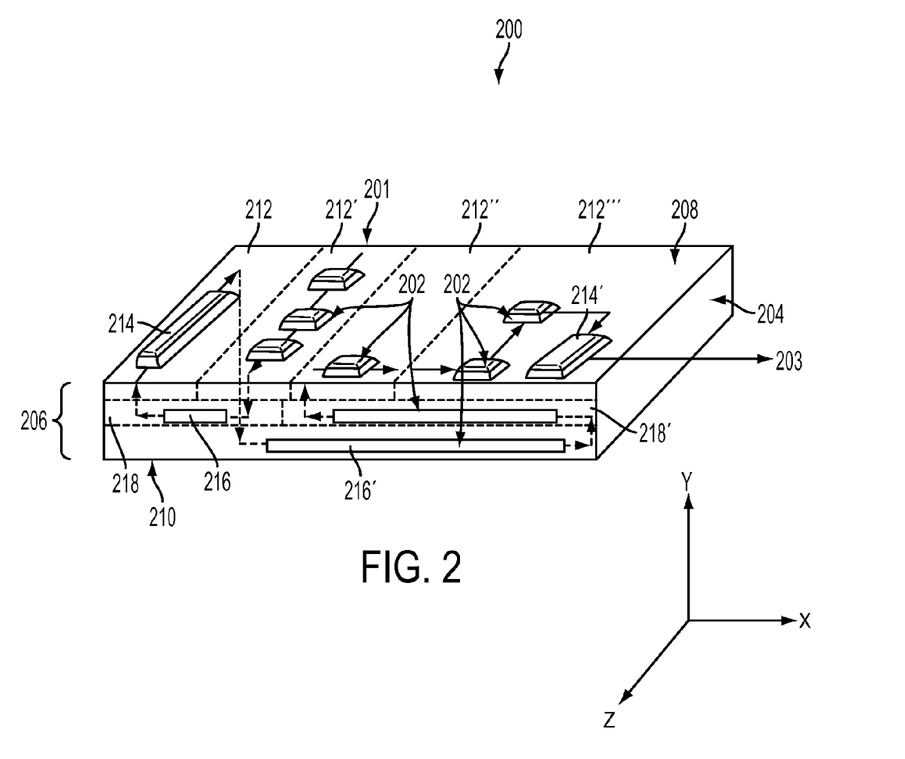
FIG. 2 is a perspective view of a printed circuit board according to an exemplary embodiment of the present disclosure.

Turning now to FIG. 2, a printed circuit board (PCB) 200 is illustrated according to an exemplary embodiment of the present disclosure. In at least one embodiment, the PCB 200 is an RF or microwave PCB configured to process an RF and/or microwave input signal 201. The PCB includes one or more circuit channels 202 formed thereon. Each circuit channel 202 receives an input 201 and comprises a plurality of sub-circuits. Each sub-circuit performs a respective electrical function on the received input to generate a main output signal 203. The plurality of sub-circuits may include, but is not limited to, a filter circuit, an amplifier circuit, a phase-lock-loop circuit, a channel, and a channel tuning circuit. The combination of electrical functions provided by sub-circuits generates an output that may be further processed and/or analyzed.

The PCB 200 includes a body 204 that extends along a first direction (e.g., the X-axis) to define a length, and a second direction (e.g., the Z-axis) perpendicular to the first direction to define a width. The body 204 further includes one or more layers 206 interposed between a first surface 208 and an opposing second surface 210 of the body. The layers 206 are stacked in a third direction (e.g., the Y-axis) perpendicular to the first and second directions to define a height. The total number of layers 206 determines the approximate height of the PCB 200.

The PCB 200 further includes one or more surface portions 212 formed on the first surface 208 and/or the second surface 210. In at least one exemplary embodiment, the surface portions 212 are formed from an electrically conductive material including, but not limited to, copper. In at least one exemplary embodiment, the first surface 208 and/or second surface 210 include a plurality of individual surface portions 212. Each of the surface portions 212 is electrically isolated from one another. In at least one embodiment, a dielectric material may be formed between each surface portion 212 to achieve the electrical isolation as understood by one of ordinary skill in the art.

The PCB 200 further includes one or more surface sub-circuits 214 and one or more embedded sub-circuits 216. The combination of surface sub-circuits 214 and embedded sub-circuits 216 form a respective circuit channel 202 formed on the PCB 200. The surface sub-circuits 214 are formed on a respective surface portion 212. In at least one embodiment, the surface sub-circuits 214 include a surface-mounted electrical components including, but not limited to, resistors, capacitors, amplifiers and integrated circuits (ICs). Accordingly, the combination of surface-mounted components formed on an individual surface portion 212 may be constructed to perform a respective electrical function. For example, a plurality of surface-mounted components formed in a first surface portion 212 may form an amplifier that amplifies the input, and a plurality of surface-mounted components formed in a second surface portion 212' may form a filter. The filter, however, may be electrically isolated from the amplifier and may not filter the same signal realized by the amplifier.

The embedded sub-circuits 216 are embedded in a respective layer 206 of the body 204. In at least one embodiment, the embedded sub-circuit 216 is different from the surface sub-circuit 214. For example, the embedded sub-circuit 216 includes, but is not limited to, a strip-line filter. The surface sub-circuit 214, however, may include a surface-mounted component that is incapable of properly being embedded in the layer 206. In at least one exemplary embodiment, the embedded sub-circuit 216 is configured to filter an RF and/or microwave signal. One or more of the layers 206 may further be divided into individual layer portions 218. Each layer portion 218 may be electrically isolated from one another, and my include a respective embedded sub-circuit 216 formed therein.

Although not illustrated in FIG. 2, electrically conductive vias may be formed through the layers 206 to electrically connect individual surface portions 212 and/or surface sub-circuits 214 to individual layers 206 and/or embedded sub-circuits 216. For example, a via may extend through the layer 206 to connect the output of an embedded strip-line filter to the input of a surface-mounted component formed on a respective surface portion 212. Accordingly, a PCB 200 according to one embodiment of the present disclosure may include a combination of surface sub-circuits 214 and embedded sub-circuits 216 formed in a non-planar arrangement to construct one or more circuit channels 202. Since the layers 206 of the PCB 200 include embedded sub-circuits 216, as opposed to merely signal lines, the layout density of the PCB 200 is reduced and the number of circuit channels 202 formed on a single PCB 200 may be increased.

Figure 3:
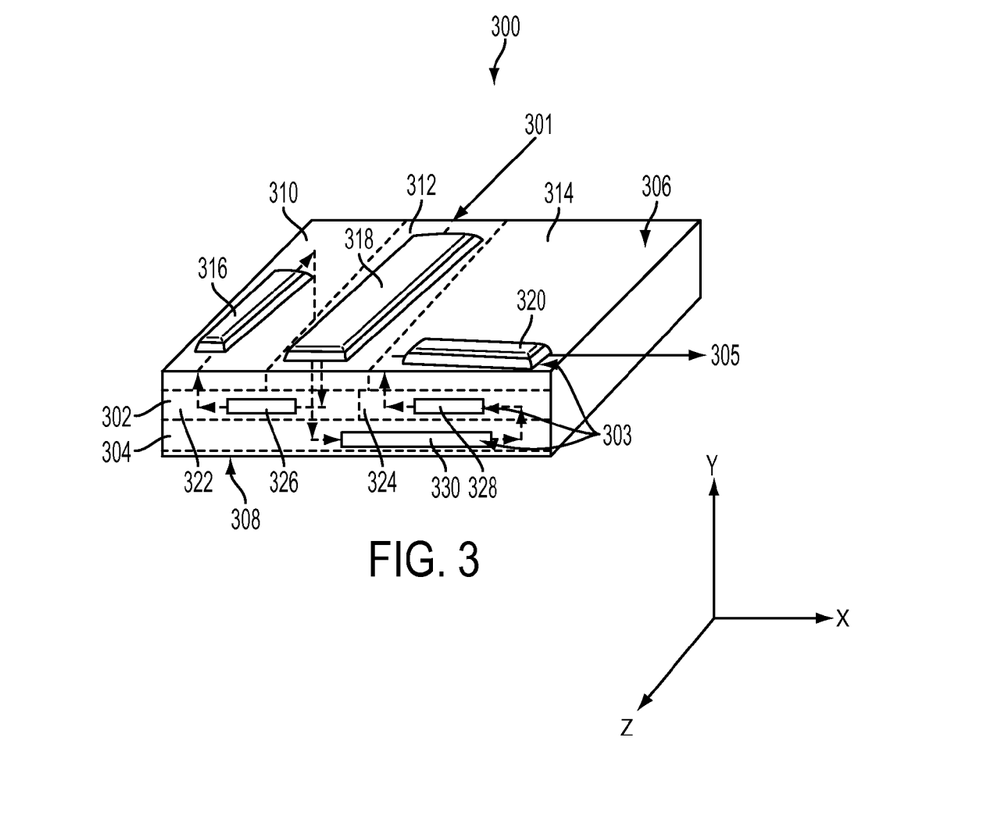
FIG. 3 is a perspective view illustrating an input signal flow of a printed circuit board according to an another exemplary embodiment of the present disclosure.

Referring to FIG. 3, a cross-section view of a PCB 300 according to an at least one embodiment illustrates an exemplary signal flow of a data signal 301 input to a circuit channel 303 formed on the PCB 300. The PCB 300 includes a plurality of layers 302-304 interposed between a first surface 306 and the second surface 308. The first surface 306 includes a plurality of surface portions 310-314. The surface portions 310-314 are electrically isolated from one another. Each surface portion 310-314 includes a respective surface sub-circuit 316-320 formed thereon.

One or more of the layers 302-304 may include individual layer portions. For example, a first layer 302 may include a first layer portion 322 and a second layer portion 324. Each layer portion 322, 324 is electrically isolated from one another. The first and second layer portions 322, 324 are also electrically isolated from the surface portions 310-314. The first layer portion 322 includes a first embedded sub-circuit 326 and the second layer portion 324 includes a second embedded sub-circuit 328. The second layer 304 includes a third embedded sub-circuit 330. The second layer 304 is also electrically isolated from the first layer 302 and the surface portions 310-314. Accordingly, the third embedded sub-circuit 330 is electrically isolated from the first and second embedded sub-circuits 326, 328.

As discussed above, electrically conductive vias may be formed through the layers 302, 304 to electrically connect individual surface sub-circuits 316-320 to respective embedded sub-circuits 326-330. The vias may also connect one or more of the embedded sub-circuits 326-330 formed in a first layer to another embedded sub-circuit 326-330 formed in a different layer. Accordingly, the electrically conductive vias may connect the inputs and/or outputs of the embedded sub-circuits 326-330 to the inputs and/or outputs of other embedded sub-circuits 326-330 and/or surface sub-circuits 316-320.

Still referring to FIG. 3, for example, surface sub-circuit 318 includes a main input that receives a main input signal 303, such as an RF input signal. The output of surface sub-circuit 318 is delivered through the second surface portion 310 and is connected to the input of the first embedded sub-circuit 326. The output of the first embedded sub-circuit 326 is connected to the input of surface sub-circuit 316. The output of surface sub-circuit 316 is delivered through layers 302-304 and is received by the input of third embedded sub-circuit 330. The output of the third embedded sub-circuit 330 is connected to the input of the second embedded sub-circuit 328 formed in the first layer 302. The output of the second embedded sub-circuit 328 is connected to the input of surface sub-circuit 320 formed on the third surface portion 314, i.e., the exterior of the first surface 306. The output of surface sub-circuit 320 generates the main output signal 305 of the respective circuit channel 303, which may be further processed and/or analyzed. As illustrated in FIG. 3, a main input signal 301 of a respective circuit channel 303 is processed and passed through various layers 302-304 in a non-planar circuit flow before generating the main output signal 305 from the respective circuit channel 303.

Figure 4:
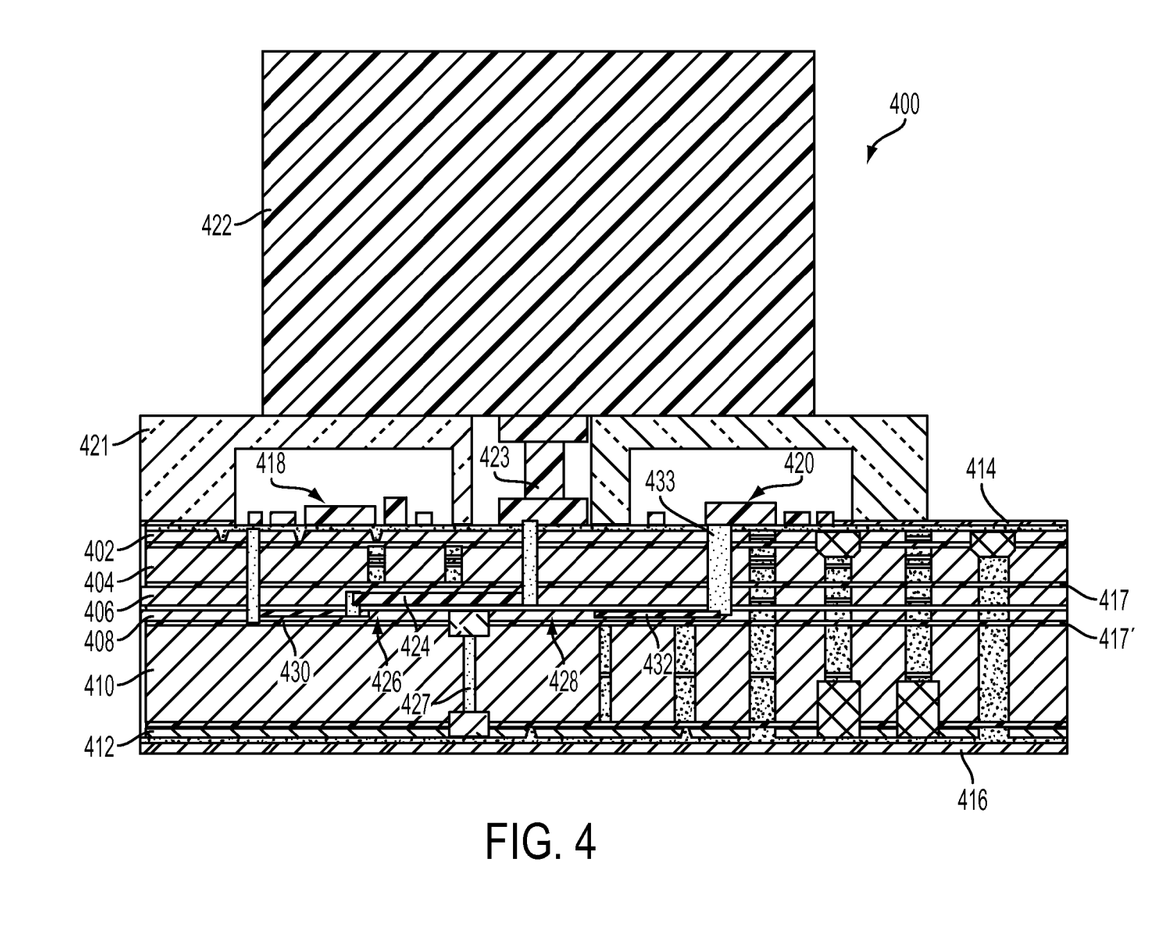
FIG. 4 is a cross-sectional view of a printed circuit board according to another exemplary embodiment of the present disclosure.

Referring now to FIG. 4, a cross-sectional view of a PCB 400 is illustrated according to another exemplary embodiment of the present disclosure. The PCB 400 includes a plurality of layers 402-412 interposed between a first surface 414 and the second surface 416. One or more of the layers 402-412 may be electrically isolated from one another. One or more ground planes 417 may electrically isolate adjacent layers 402-412. As further illustrated in FIG. 4, for example, a pair of ground planes 417 isolates layer 406. More specifically, a first ground plane 417 is formed between layer 404 and layer 406 and a second ground plane 417' is formed between layer 406 and layer 408. Accordingly, layer 406 may be electrically isolated from layers 404 and 408.

The first surface 414 includes a first surface sub-circuit 418 and a second surface sub-circuit 420. The first surface sub-circuit 418 is formed on an exterior surface of a first surface portion. The second surface sub-circuit 420 is formed on an exterior surface of a second surface portion different from the first surface portion. The first surface portion and second surface portion are electrically isolated from one another (except where connected, for example by a wire or trace, to route the signal from one section to the other section) such that the first surface sub-circuit 418 and second surface sub-circuit 420 are electrically isolated from each.

The first surface sub-circuit 418 and second surface sub-circuit 420 may each be surrounded by a respective shielding component 421. The shielding component 421 electromagnetically isolates the first surface sub-circuit 418 from the second surface sub-circuit 420. The shielding component 421 may be formed of various materials configured to inhibit electromagnetic waves from propagating therethrough as understood by those ordinarily skilled in the art. An external packaged component 422 may be formed on the shielding component 421 and above the first surface sub-circuit 418 and second surface sub-circuit 420. The external packaged component 422 may include, but is not limited to, an amplifier, a filter, a resistor, a capacitor, a transformer, and an IC. An external connector 423 may electrically connect the external packaged filter 422 to a ground plane and/or power plane formed on the first surface of the board. The external connector 423 may also connect the external packaged component 422 to a component (e.g., strip-line filter, ground plane, power plane, etc.) embedded in one or more of the layers 402-412. Accordingly, large externally packaged filters may be raised above the surface of the board such that additional surface portions may be formed to receive one or more surface sub-circuits 418, 420.

One or more of the layers 402-412 may include one or more embedded sub-circuits 424, 430. For example, layer 406 includes a first embedded sub-circuit 424 embedded therein. In addition, one or more of the layers 402-412 may include individual layer portions. For example, layer 408 includes a first layer portion 426 and a second layer portion 428. The first layer portion 426 is electrically isolated from the second layer portion 428 using a grounded isolation via 427 as further illustrated in FIG. 4. The first and second layer portions 426, 428 may also be electrically isolated from one or more of the surface sub-circuits 418, 420. The first layer portion 426 includes a second embedded sub-circuit 430 and the second layer portion 428 includes a third embedded sub-circuit 432.

As discussed above, one or more electrically conductive vias 433 may be formed through the layers 402-412 to electrically connect individual surface sub-circuits to respective embedded sub-circuits. The vias 433 may also connect an embedded sub-circuit formed in a first layer to another embedded sub-circuit formed in a different layer. Accordingly, the electrically conductive vias 433 may connect the inputs and/or outputs of the embedded sub-circuits to the inputs and/or outputs of other embedded sub-circuits and/or surface sub-circuits. For example, a via 433 may electrically connect the third embedded sub-circuit 432 to the second surface sub-circuit 420. In addition, another via 433 may electrically connect the first embedded sub-circuit 424 with the second embedded sub-circuit 430. The output of the second embedded sub-circuit 430 may be electrically connected to the first surface sub-circuit 418 using another via 433.

Figure 5:
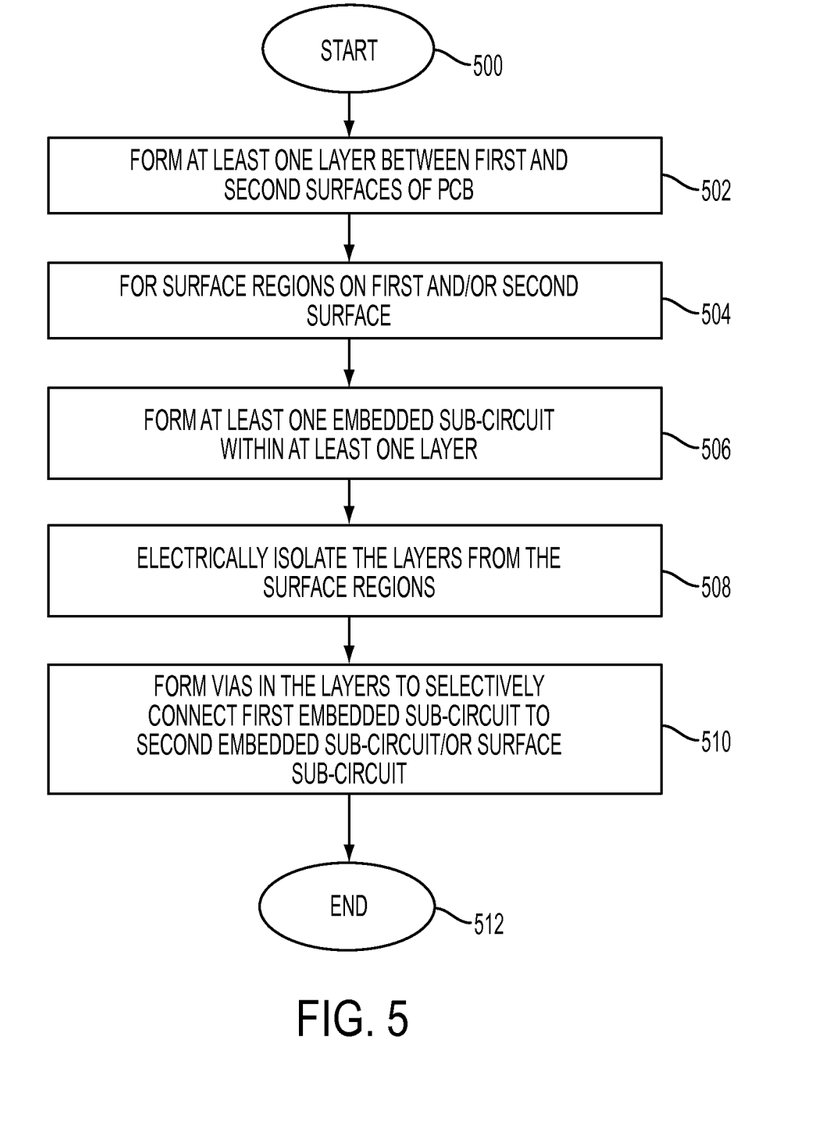
FIG. 5 is a flow diagram illustrating a method of fabricating a printed circuit board according to an exemplary embodiment of the present disclosure.

Referring now to FIG. 5, a method of fabricating a printed circuit board is illustrated according to an exemplary embodiment of the present disclosure. The method begins at operation 500, and at operation 502 at least one layer is formed between first and second opposing surfaces of the printed circuit board. At operation 504, a plurality of surface portions are formed on at least one of the first and second surfaces. In at least one embodiment, the plurality of surface portions are formed of copper. The surface portions may be configured to receive a surface-mounted electrical component, and to electrically conduct current thereto. The surface-mounted electrical component includes, but is not limited to, a resistor, a capacitor and an amplifier.

At operation 506, one or more embedded sub-circuits of the at least one circuit channel are embedded within one or more of the layers. In at least one embodiment, the at least one embedded sub-circuit includes a strip-line filter, for example. The strip-line filter may be configured to filter an RF and/or microwave signal. In addition, the operation of forming at least one embedded sub-circuit in the layer includes embedding a first embedded sub-circuit and a second embedded sub-circuit in a common layer. The first and second embedded sub-circuits are formed such that each embedded sub-circuit is electromagnetically isolated from one another. At operation 508, the layer is electrically isolated from the first and second surfaces such that the embedded sub-circuit is electrically isolated from the plurality of surface portions. At operation 510, one or more vias are formed in the layers and extend therethrough. The vias may selectively connect a surface sub-circuit and/or embedded sub-circuit to a desired embedded sub-circuit, and the method ends at operation 512. Accordingly, selected embedded sub-circuits may be connected to one another or to a selected surface sub-circuit, while still isolating remaining surface and/or embedded sub-circuits from one another. In at least one embodiment, a dielectric material may also be formed in the at least one layer to surround the embedded sub-circuit. Accordingly, the embedded sub-circuit may be electro-magnetically isolated from the plurality of surface portions.

The corresponding structures, materials, acts, and equivalents of all means or step plus function elements in the claims below are intended to include any structure, material, or act for performing the function in combination with other claimed elements as specifically claimed. The description has been presented for purposes of illustration and examples, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the inventive teachings and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various modifications to the exemplary embodiments which fall within the scope of the following claims. These claims should be construed to maintain the proper protection for the invention first described.

What is claimed is:

1. A printed circuit board having a plurality of circuit channels formed thereon, the printed circuit board comprising:
   a body extending along a first direction to define a length, and a second direction perpendicular to the first direction to define a width, the body including:
   at least one layer extending in a third direction perpendicular to the first direction and the second direction, the at least one layer interposed between a first surface and an opposing second surface, wherein the at least one layer includes a first layer portion and a second layer portion; and a plurality of surface portions formed on at least one of the first surface and the second surface, the plurality of surface portions including a first surface portion having a first surface sub-circuit formed thereon, and a second surface portion having a second surface sub-circuit formed thereon, the first and second surface portions formed from an electrically conductive material;

the printed circuit board including at least one surface sub-circuit of a first circuit channel among the plurality of circuit channels, the at least one surface sub-circuit formed on at least one of the first and second surfaces; and at least one embedded sub-circuit of the first circuit channel, the embedded sub-circuit being different from the at least one surface sub-circuit and being embedded in the at least one layer, wherein the at least one embedded sub-circuit includes a first strip-line filter embedded in the first layer portion and a second strip-line filter embedded in the second layer portion, the first and second strip-line filters being electrically isolated from the first and second surface portions.

2. The printed circuit board of claim 1, wherein the first layer portion is electromagnetically isolated from the second layer portion.

3. The printed circuit board of claim 2, wherein the second surface portion is electrically isolated from the first surface portion.

4. The printed circuit board of claim 1, wherein the first embedded sub-circuit includes an input and an output, the input being in electrical communication with the first surface sub-circuit and the output being in electrical communication with the second surface sub-circuit.

5. The printed circuit board of claim 4, wherein the first surface includes a third surface portion having a third surface sub-circuit formed thereon, the third surface sub-circuit being electrically isolated from the first and second surface portions, and wherein the at least one layer includes a second layer having a third layer portion, the third layer portion including a third embedded sub-circuit different from the first and second embedded sub-circuits.

6. The printed circuit board of claim 5, wherein the third embedded sub-circuit includes an input in electrical communication with the second surface sub-circuit, and an output in electrical communication with the second embedded sub-circuit.

7. The printed circuit board of claim 6, wherein the second embedded sub-circuit includes an output in electrical communication with the third surface sub-circuit, the third surface sub-circuit including a main output of the first circuit channel.

8. The printed circuit board of claim 7, wherein a first electrically conductive via extends through the at least one layer and connects the input of the first embedded sub-circuit with an output of the first surface sub-circuit, a second electrically conductive via extends through the at least one layer and connects the output of the first embedded sub-circuit with an input of the second surface sub-circuit, a third electrically conductive via extends through the at least one layer and connects an output of the second surface sub-circuit with the input of the third embedded sub-circuit, a fourth electrically conductive via extends through the at least one layer and connects the output of the third embedded sub-circuit with the input of the second embedded sub-circuit, and a fifth electrically conductive via extends through the at least one layer and connects the output of the second embedded sub-circuit with an input of the third surface sub-circuit.

9. The printed circuit board of claim 1, wherein the first and second surface sub-circuits include surface mounted electronic components, the surface-mounted electronic components including at least one of a resistor, capacitor and an amplifier.

10. A printed circuit board including a plurality of sub-circuits that form at least one circuit channel, the printed circuit board comprising:

a first surface, a second surface opposite the first surface, and at least one layer interposed between the first and second surfaces, the at least one layer electromagnetically isolated from the first and second surfaces;

a plurality of surface portions formed on the first surface; and at least one embedded sub-circuit of the at least one circuit channel, the at least one embedded sub-circuit being embedded in the at least one layer and being electromagnetically isolated from the plurality of surface portions, wherein the plurality of surface portions are formed from an electrically conductive material, and the at least one embedded sub-circuit is a strip-line filter.

11. The printed circuit board of claim 10, wherein the plurality of surface portions are formed from copper.

12. The printed circuit board of claim 11, wherein the at least one layer includes a first electrical insulator interposed between the first surface and the strip-line filter and a second electrical insulator interposed between the second surface and the strip-line filter, the first and second electrical insulators electromagnetically insulating the strip-line filter from the plurality of surface portions.

13. The printed circuit board of claim 12, wherein the strip-line filter is configured to filter a radio-frequency (RF) signal, and wherein the plurality of surface sub-circuits includes at least one of a resistor, a capacitor and an amplifier.

14. The printed circuit board of claim 13, wherein the at least one embedded sub-circuit includes a first embedded sub-circuit and a second embedded sub-circuit, the first and second embedded sub-circuits being electromagnetically isolated from one another.

15. A method of fabricating a printed circuit board, the method comprising:

forming at least one layer between first and second opposing surfaces of the printed circuit board;

forming a plurality of surface portions on at least one of the first and second surfaces;

embedding at least one embedded sub-circuit of the at least one circuit channel in the at least one layer; and electromagnetically isolating the least one layer from the first and second surfaces such that the embedded sub-circuit is electromagnetically isolated from the plurality of surface portions, wherein the plurality of surface portions are formed from an electrically conductive material, and the at least one embedded sub-circuit is a strip-line filter.

16. The method of claim 15, wherein the plurality of surface portions are formed from copper.

17. The method of claim 15, wherein the at least one layer includes a first electrical insulator interposed between the first surface and the strip-line filter and a second electrical insulator interposed between the second surface and the strip-line filter, the first and second electrical insulators electromagnetically insulating the strip-line filter from the plurality of surface portions.

18. The method of claim 17, wherein the strip-line filter is configured to filter a radio-frequency (RF) signal, and wherein the plurality of surface sub-circuits include at least one of a resistor, a capacitor and an amplifier.

19. The method of claim 18, wherein the at least one embedded sub-circuit includes a first embedded sub-circuit and a second embedded sub-circuit, the first and second embedded sub-circuits being electromagnetically isolated from one another.

* * * * *